(12) United States Patent
Mazur et al.

(10) Patent No.: US 7,816,220 B2
(45) Date of Patent: Oct. 19, 2010

(54) LASER-INDUCED STRUCTURING OF SUBSTRATE SURFACES

(75) Inventors: Eric Mazur, Concord, MA (US); Mengyan Shen, Belmont, MA (US)

(73) Assignee: President & Fellows of Harvard College, Cambridge, MA (US)

( * ) Notice: Subject to any disclaimer, the term of this patent is extended or adjusted under 35 U.S.C. 154(b) by 164 days.

(21) Appl. No.: 12/038,209

(22) Filed: Feb. 27, 2008

(65) Prior Publication Data

US 2009/0213883 A1 Aug. 27, 2009

(51) Int. Cl.
*H01L 21/336* (2006.01)
(52) U.S. Cl. .............................. 438/308; 257/E21.347; 257/E21.475; 438/378; 438/795
(58) Field of Classification Search .......... 257/E21.347, 257/E21.475; 438/308, 378, 795
See application file for complete search history.

(56) References Cited

U.S. PATENT DOCUMENTS

| | | | |
|---|---|---|---|
| 6,048,588 A * | 4/2000 | Engelsberg | 427/554 |
| 7,057,256 B2 * | 6/2006 | Carey et al. | 257/463 |
| 2005/0226287 A1 * | 10/2005 | Shah et al. | 372/25 |
| 2006/0079062 A1 * | 4/2006 | Mazur et al. | 438/308 |

OTHER PUBLICATIONS

Zhu et al., "Effect of Polarization on Femtosecond Laser Pulses Structuring Silicon Surface", Applied Surface Science, vol. 252 (2006), p. 2752-2756.*
Huang et al., "A uniform 290 nm periodic Square Structure on ZnO Fabricated by Two—Beam Femtosecond Laser Ablation," Nanotechnology, (2007), 18 (50), 505301/1-505301/6.*
International Search Report and Written Opinion for PCT/US09/35239 dated May 8, 2009 (11 pages).

* cited by examiner

*Primary Examiner*—Asok K Sarkar
(74) *Attorney, Agent, or Firm*—Thomas J. Engellenner; Reza Mollaaghababa; Nutter McClennen & Fish LLP (57) ABSTRACT

In one aspect, the present invention provides a method of processing a substrate, e.g., a semiconductor substrate, by irradiating a surface of the substrate (or at least a portion of the surface) with a first set of polarized short laser pulses while exposing the surface to a fluid to generate a plurality of structures on the surface, e.g., within a top layer of the surface. Subsequently, the structured surface can be irradiated with another set of polarized short laser pulses having a different polarization than that of the initial set while exposing the structured surface to a fluid, e.g., the same fluid initially utilized to form the structured surface or a different fluid. In many embodiments, the second set of polarized laser pulses cause the surface structures formed by the first set to break up into smaller-sized structures, e.g., nano-sized features such as nano-sized rods.

25 Claims, 6 Drawing Sheets

- 12 — PLACE AT LEAST A PORTION OF A SUBSTRATE SURFACE IN CONTACT WITH A FLUID, E.G., A LIQUID
- 14 — APPLY A PLURALITY OF POLARIZED SHORT RADIATION PULSES TO SAID PORTION OF THE SUBSTRATE SURFACE TO GENERATE A PLURALITY OF STRUCTURES IN A TOP SURFACE LAYER
- 16 — APPLY ANOTHER SET OF POLARIZED RADIATION PULSES HAVING A DIFFERENT POLARIZATION TO THE STRUCTURED SUBSTRATE SURFACE WHILE THE SURFACE IS IN CONTACT WITH A FLUID TO FURTHER MODIFY THE SURFACE TOPOGRAPHY

LASER-INDUCED STRUCTURING OF SUBSTRATE SURFACES

GOVERNMENT SUPPORT

This invention was made with government support by Army Research Office under grants W911NF-05-1-0341 and W911NF-06-1-0097 and by National Science Foundation under grant DMR-0213805. The U.S. government has certain rights in this invention.

BACKGROUND

The present invention relates generally to methods of processing substrates by applying short laser pulses to the substrates and the resultant structured substrates.

A variety of techniques are known for generating small-sized features on solid substrate surfaces, such as semiconductor surfaces. Some examples of these techniques include lithography and chemical etching that provide control over the shape and the size of the structures. However, such techniques are often complex and costly. Pulsed laser-assisted etching is another technique for fabricating small structures directly onto a substrate. The typical sizes of such structures are, however, larger than the laser wavelength.

Accordingly, there is a need for improved methods for generating small-sized features on a substrate surface.

SUMMARY

The present invention relates generally to methods of structuring substrates and the resultant structured substrates in which a plurality of micron-sized and/or submicron-sized features are formed in a top surface layer of the substrate. In some cases, such structuring of a substrate, e.g., a semiconductor substrate, can be achieved by irradiating a substrate surface, while in contact with a fluid (e.g., a liquid), with a plurality of polarized short radiation pulses, where the polarization of some of the pulses is different than that of the others. For example, in some embodiments, the substrate surface can be irradiated with a first set of linearly polarized short laser pulses while exposed to a liquid to form a plurality of features in a top layer thereof. Subsequently, the structured surface can be irradiated with a second set of linearly polarized short laser pulses with a different polarization axis (e.g., a polarization rotated by 90°) so as to break up the surface features formed by the first set into smaller-sized features.

In one aspect, the present invention provides a method of processing a substrate, e.g., a semiconductor substrate, by irradiating a surface of the substrate (or at least a portion of the surface) with a first set of polarized short laser pulses while exposing the surface to a fluid to generate a plurality of structures on the surface, e.g., within a top layer of the surface. Subsequently, the structured surface can be irradiated with another set of polarized short laser pulses having a different polarization than that of the initial set while exposing the structured surface to a fluid, e.g., the same fluid initially utilized to form the structured surface or a different fluid. In many embodiments, the second set of polarized laser pulses cause the surface structures formed by the first set to break up into smaller-sized structures, e.g., nano-sized features such as nano-sized rods.

In some cases, a surface density of the nanosized structures (e.g., nanosized rods) can be in a range of about $1 \times 10^8$ cm$^{-2}$ to about $1 \times 10^{11}$ cm$^{-2}$, e.g., in a range of about $5 \times 10^9$ cm$^{-2}$ to about $5 \times 10^{10}$ cm$^{-2}$.

In some cases, the surface structures generated after the application of the first set of pulses are in the form of ripples extending across the surface with a spacing that is substantially equal to the wavelength of the incident radiation or less than that wavelength. In some cases in which the radiation pulses in the first set are linearly polarized, the long axis of the ripples is substantially aligned with the direction of the polarization. In some cases, the second set of pulses can break up the ripples into nano-sized rods, e.g., having a diameter in a range of about 50 nm to about 200 nm and a height in a range of about 50 nm to about 500 nm.

In a related aspect, the short radiation pulses have pulse widths in a range of about 10 femtoseconds (fs) to about few hundred (e.g., 500) nanoseconds (ns), and preferably in a range of about 100 fs to about 1 picosecond, and more preferably in a range of about 100 fs to about 500 fs. In many embodiments, the pulse wavelengths (central wavelength of a pulse) in either set can be, e.g., in a range of about 400 nanometers (nm) to about 800 nm. Further, the energy of a pulse in either set can be in a range of about 10 microjoules (μJ) to about 400 microjoules, e.g., in a range of about 60 μJ to about 100 μJ.

In another aspect, the pulses are directed to the surface, e.g., focused onto the surface such that the fluence of a laser pulse at the substrate surface in either set is less than about 40 kJ/m². By way of example, the pulse fluence can be in a range of about 0 kJ/m² to about 30 kJ/m², and preferably in a range of about 1 kJ/m² to about 4 kJ/m². In some embodiments, the fluence of the laser pulses in the second set are less than the fluence of the laser pulses in the first set. For example, the fluence of the laser pulses in the second set at the substrate surface can be less than the respective fluence of the pulses in the first set by about 50%, or preferably by about 25%.

In another aspect, the fluid utilized in at least one of the irradiation steps, and in many cases in both irradiation steps, comprises a liquid. Some examples of such a liquid can include, without limitation, water or alcohol. In some cases, the liquid can comprise an electron-donating aqueous solution, e.g., an aqueous solution of sulfuric acid. In some cases, the fluid in contact with the substrate surface in at least one of the irradiation steps comprises a gas. Some examples of a gas suitable for use in the practice of the invention include sulfur hexafluoride (SF$_6$), nitrogen (N$_2$), H$_2$S or air.

In a related aspect, in the above method, the radiation pulses in one set are linearly polarized with a polarization axis along a given direction while the radiation pulses in the other set are linearly polarized with their polarization axis along a different direction. For example, in some cases, the polarization axes associated with the radiation pulses in two sets can be orthogonal to one another. In other cases, the radiation pulses are circularly polarized with the polarization sense in one set being opposite to that in the other set (e.g., the polarization sense in one set can be clockwise and in the other set counter-clockwise).

The above method can be applied to different types of substrates. By way of example, the substrate can be a semiconductor substrate, such as, silicon, germanium, doped or undoped. In other cases, the substrate can be any of glass, metal, or insulator.

In another aspect, a method of structuring a substrate, e.g., a semiconductor substrate, is disclosed that includes applying a plurality of short laser pulses, e.g., pulses having durations in a range of about 20 fs to about 20 ns, to a surface of the substrate while the surface is in contact with a gas, e.g., SF$_6$ or N$_2$, to generate a plurality of micron-sized features, e.g., spikes, on the surface, e.g., in a top layer of the surface.

Subsequently, the structured (roughened) surface can be subjected to two separate sets of short laser pulses having different polarization while in contact with a liquid, to generate a plurality of nano-sized features (e.g., nanosized rods). By way of example, the roughened surface can be irradiated with one set of polarized radiation pulses having a temporal duration in a range of about 10 fs to about a few nanoseconds (e.g., 10 ns) while the surface is in contact with a liquid, such as water, and subsequently be irradiated with another set of polarized short radiation pulses with a different polarization while the surface is in contact with a liquid.

In some cases, the nano-sized features can be superimposed on the micron-sized features. By way of example, the nano-sized features can be in the form of nano-sized rods (e.g., rods having diameters in a range of about 50 nm to about 200 nm and heights that are less than about 1000 nm) that extend from the micron-sized features, e.g., in a upwardly normal direction.

In another aspect, a method of structuring a semiconductor substrate is disclosed that includes applying a plurality of polarized short laser pulses to the substrate surface such that at least two of the pulses have different polarizations while the surface is exposed to a liquid so as to generate a plurality of nano-sized structures on the surface.

In another aspect, a semiconductor substrate is disclosed that includes a plurality of micron-sized structures disposed in a top surface layer of the substrate, and a plurality of nanosized structures that are superimposed on the micron-sized structures.

In another aspect, the invention provides a method of processing a substrate by irradiating at least a portion of the substrate surface with circularly polarized short radiation pulses while exposing the surface portion to a fluid, e.g., a liquid, so as to generate a plurality of structures, e.g., micron-sized and/or submicron-sized structures, in a top surface layer of the substrate.

In a related aspect, the circularly polarized pulses can have a temporal duration in a range of about 20 fs to about a few hundred nanoseconds, e.g., in a range of about 20 fs to about 500 fs. Further, the pulses can have a fluence in range of about 2 kJ/m$^2$ to about 40 kJ/m$^2$.

Further understanding of the invention can be obtained by reference to following detailed description in conjunction with the associated drawings, which are described briefly below.

DETAILED DESCRIPTION

The present invention relates generally to methods for structuring substrates, e.g., semiconductor substrates, in which a plurality of polarized short radiation pulses can be applied to a surface of the substrate while the surface is in contact with a fluid, e.g., a liquid such as water. Subsequently, the irradiated surface is exposed to a plurality of polarized short radiation pulses having a different polarization while the surface is contact with a fluid, e.g., a liquid. In many embodiments, this two-step irradiation process can cause generation of nanometer-sized features in a top surface layer of the substrate, e.g., by breaking up the features formed during the first radiation step into smaller-sized features. The term "short radiation pulses," as used herein, refers to pulses of electromagnetic radiation having a temporal duration in a range of about 10 femtoseconds (fs) to about a few hundred (e.g., 500 ns) nanoseconds (ns), preferably in a range of about 20 fs to about 500 fs (e.g., 100 fs).

Figure 1:
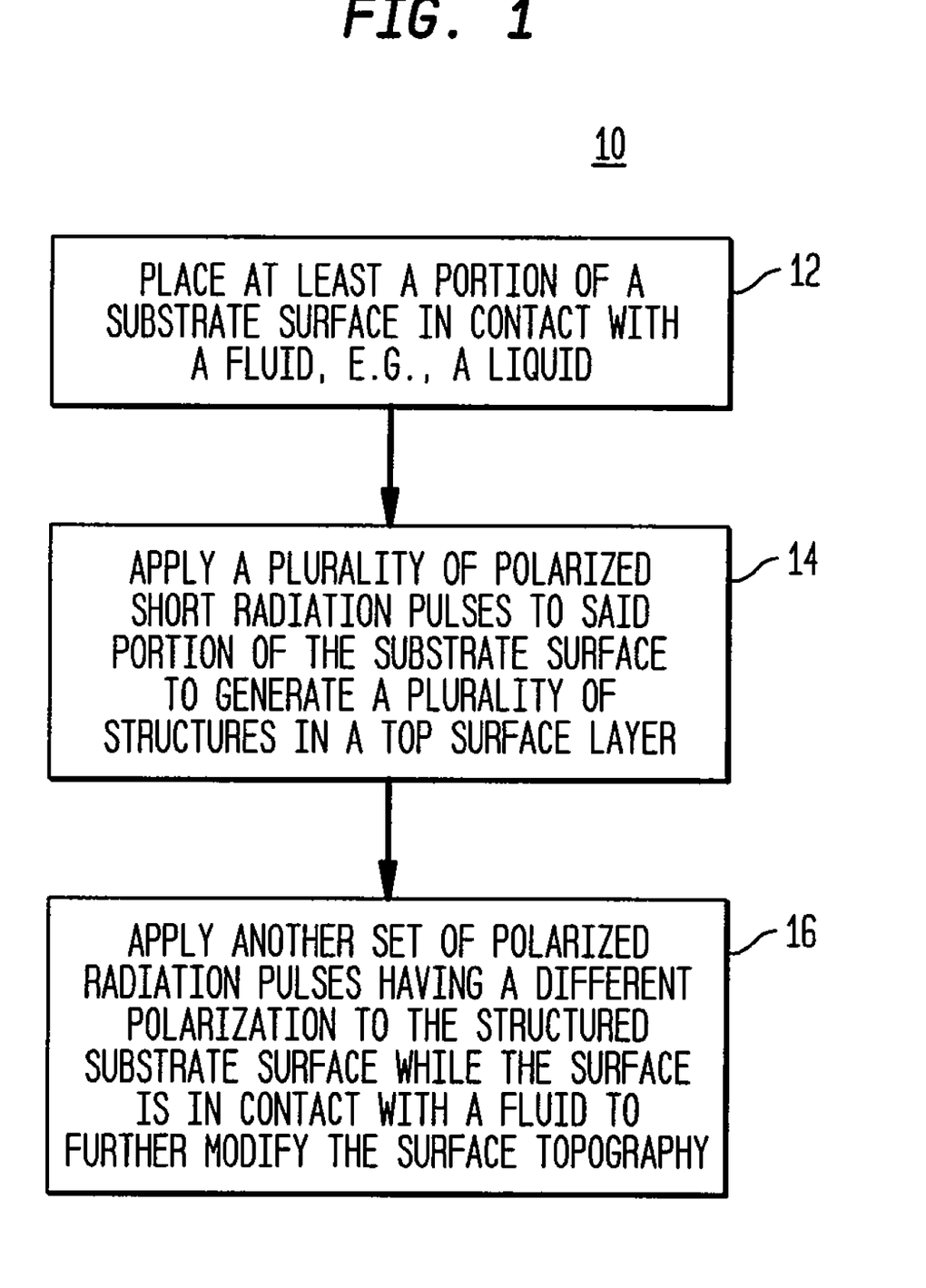
FIG. 1 is a flow chart depicting various steps in an embodiment of a method according to the teachings of the invention for structuring a substrate surface.

With reference to a flow chart 10 of FIG. 1, in one exemplary embodiment of a method according to the teachings of the invention for processing a substrate, e.g., a semiconductor substrate, in a step 12, at least a portion of the substrate surface is exposed to a fluid, for example, by disposing a layer of the fluid over that portion. In many cases, the fluid comprises a liquid, such as water, alcohol or any other suitable fluid.

In another step 14, the substrate portion that is in contact with the fluid is exposed to one or more short polarized radiation pulses (e.g., laser pulses) so as to modify its surface topography. In many embodiments, the radiation pulses exhibit a linear polarization along a selected direction, though in other embodiments radiation pulses having circular polarization can be employed.

The radiation pulses can have temporal durations (pulse widths) in a range of about 20 fs to about a few hundred ns, and more preferably in a range of about 50 fs to about 500 fs. In this exemplary embodiment, the center wavelength of the pulses is chosen to be about 800 nm. More generally, radiation wavelengths in a range of about 200 nm to about 800 nm can be employed. The pulse energies can be in a range of about 10 microjoules to about 100 millijoules.

In many embodiments, the fluid is selected to be substantially transparent to radiation having at least one wavelength component in a range of about 200 nm to about 800 nm. Further, the thickness of the fluid layer is preferably chosen so as to ensure that it would not interfere with the radiation pulses (e.g., via excessive self-focusing of the pulses) in a manner that would inhibit irradiation of the substrate surface. While in this embodiment water is selected as the fluid, in other embodiments other suitable polar or non-polar liquids can be employed. Some examples of such liquids include, without limitation, alcohol and silicon oil. In other embodiments, the fluid can comprise a gas, e.g., $SF_6$, $N_2$ or air.

In many embodiments, the radiation pulses are focused onto the substrate's surface, e.g., in a direction normal to the surface, such that the radiation fluence on the surface is greater than about 2 $kJ/m^2$. In general, in many embodiments, the radiation fluence can be less than about 40 $kJ/m^2$, e.g., in a range of about 2 $kJ/m^2$ to about 30 $kJ/m^2$. Further, in many embodiments, the substrate can be moved relative to the radiation and/or the radiation beam can be moved relative to the substrate's surface so that different portions of the substrate surface can be exposed to the radiation pulses.

In this embodiment, the substrate is translated relative to the radiation beam while irradiating the substrate surface to short laser pulses such that a portion of the surface is exposed to the laser pulses—in other cases a radiation beam can be moved over the substrate while the substrate remains stationary. Generally, the repetition rate of the laser pulses and the translational speed of the substrate are selected such that each area of the surface is exposed to a number of pulses ranging from 1 pulse to about 2500 pulses, and more typically a few hundred pulses.

In some embodiments, the teachings of U.S. Published Patent Application No. 2006/0079062 entitled "Femtosecond Laser-Induced Formation of Submicrometer Spikes On A Semiconductor Substrate," which is herein incorporated by reference in its entirety, can be used to carry out irradiation of the substrate in the aforementioned step 14.

The radiation pulses can modify the surface topography to generate a plurality of surface features, e.g., microns-sized and/or submicron-sized features on the surface. The type of surface modifications generated by the exposure of the surface to the radiation pulses in step 14 can depend, at least in part, on the wavelength of the radiation pulses as well as their fluence. By way of example, the experimental results discussed further below show that in some cases the exposure of a silicon substrate to 800 nm, 100 femtosecond pulses (about 200 laser pulses per area) having a linear polarization can result in different substrate surface modifications based on the fluence of the pulses.

Figure 2A:
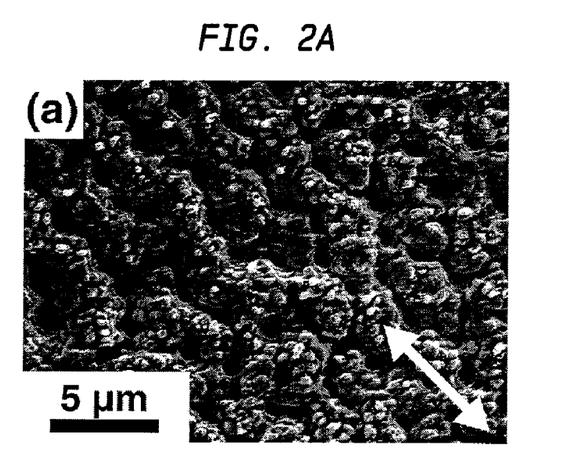
FIG. 2A is an SEM image of a silicon substrate surface after its exposure to a set of polarized femtosecond laser pulses while in contact with water, where the pulses have a fluence of 25 kJ/m$^2$ at the substrate surface.
Figure 2B:
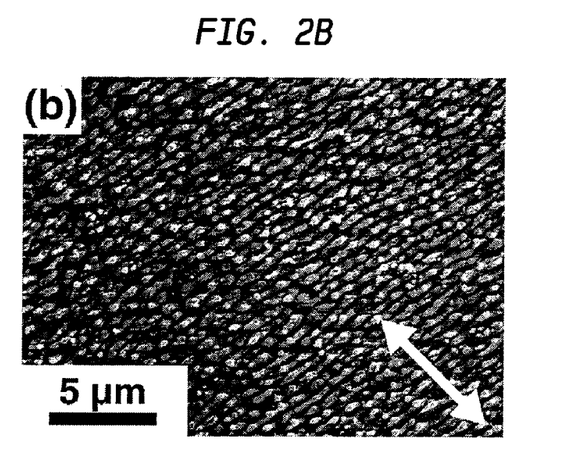
FIG. 2B is an SEM image of a silicon substrate surface after its exposure to a set of polarized femtosecond laser pulses while in contact with water, where the pulses have a fluence of 5 kJ/m$^2$ at the substrate surface.
Figure 2C:
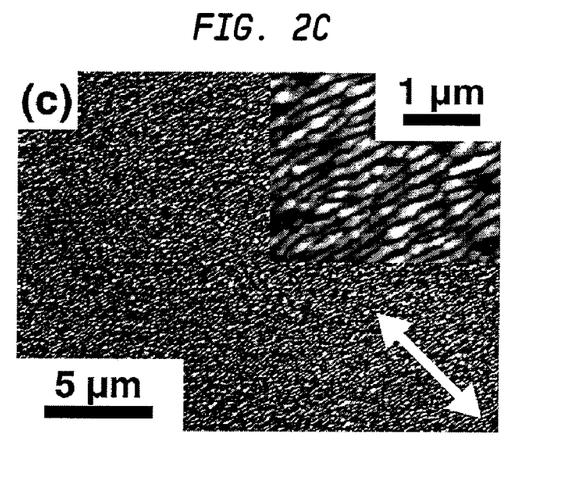
FIG. 2C is an SEM image of a silicon substrate surface after its exposure to a set of polarized femtosecond laser pulses while in contact with water, where the pulses have a fluence of 3 kJ/m$^2$ at the substrate surface.

For example, in a high fluence regime (e.g., a fluence greater than about 10 $kJ/m^2$) micrometer-scale structures and submicrometer-sized holes can be formed on a silicon substrate, as shown in FIG. 2A. In a medium fluence regime (e.g., a fluence in a range of about 4 $kJ/m^2$ to about 10 $kJ/m^2$), a plurality of straight ripples can be formed on a silicon substrate, as shown in FIG. 2B, with the ripple spacing being substantially equal to the wavelength of incident pulses. The long axis of the ripples shown in FIG. 2B is substantially perpendicular to the direction of the polarization of the laser pulses. In a low fluence regime (e.g., a fluence in a range of about 2 to about 4 $kJ/m^2$), straight ripples can be formed on a silicon substrate, which in this case show a spacing of about 120 nm, as shown in FIG. 2C. FIGS. 2A-2C are provided only for illustrative purposes, and it should be understood that in other cases the shapes and the sizes of the features formed on a substrate by exposing it to radiation pulses in step 14 of an embodiment of the method of the invention can be different than those depicted in those figures.

Referring again to the flow chart of FIG. 1, in another step 16, the substrate surface that was structured via exposure to the radiation pulses in step 14 is irradiated again, while the substrate surface is in contact with a fluid, e.g., the same fluid utilized in step 14 or a different fluid, with a plurality of short laser pulses having a polarization that is different than that of the radiation pulses utilized in step 14. By way of example, the radiation pulses applied to the substrate in the subsequent step 16 can have a linear polarization that is rotated by 90 degrees relative to a linear polarization employed in step 14. In other cases in which the radiation pulses employed in step 14 exhibit a circular polarization, the radiation pulses utilized in step 16 can have a circular polarization with an opposite sense (e.g., when the circular polarization is step 14 is clockwise, the polarization of the pulses in step 16 can be counter-clockwise).

Similar to step 14, the central wavelength of the laser pulses employed in step 16 can be generally in a range of about 400 nm to about 800 nm. In this embodiment, the wavelength is assumed to be 800 nm. Further, in many embodiments, the radiation pulse widths can be in a range of about 10 fs to about a few nanoseconds, and more preferably in a range of about 50 fs to about 500 fs. Although in general the fluence of the radiation pulses utilized in step 16 at the substrate surface can be in a range of about 2 $kJ/m^2$ to about 30 $kJ/m^2$, in many cases the fluence of the radiation pulses utilized in step 16 is less than the respective pulses utilized in step 14, e.g., by a factor in a range of about 10% to about 50%.

While in this embodiment, the fluid that is in contact with the substrate surface in step 16 is the same type of fluid as that employed in step 14, in other embodiments, two different types of fluids can be employed in steps 14 and 16.

Figure 3A:
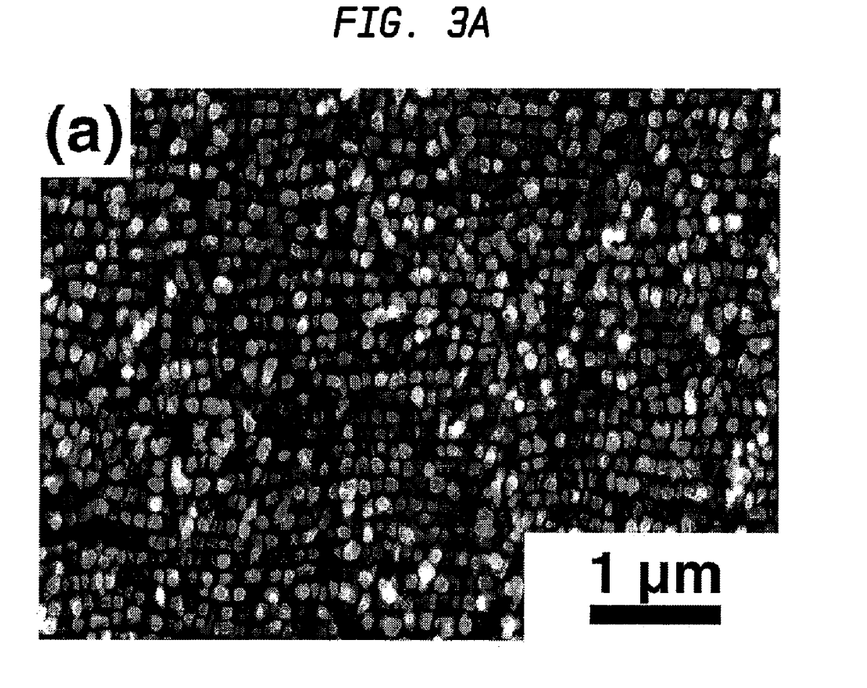
FIG. 3A is an SEM image of the structured silicon surface shown in FIG. 2C after its exposure to another set of polarized femtosecond pulses having a different polarization while in contact with water, where the pulses exhibited a fluence of 0.5 kJ/m$^2$ at the substrate surface.
Figure 3B:
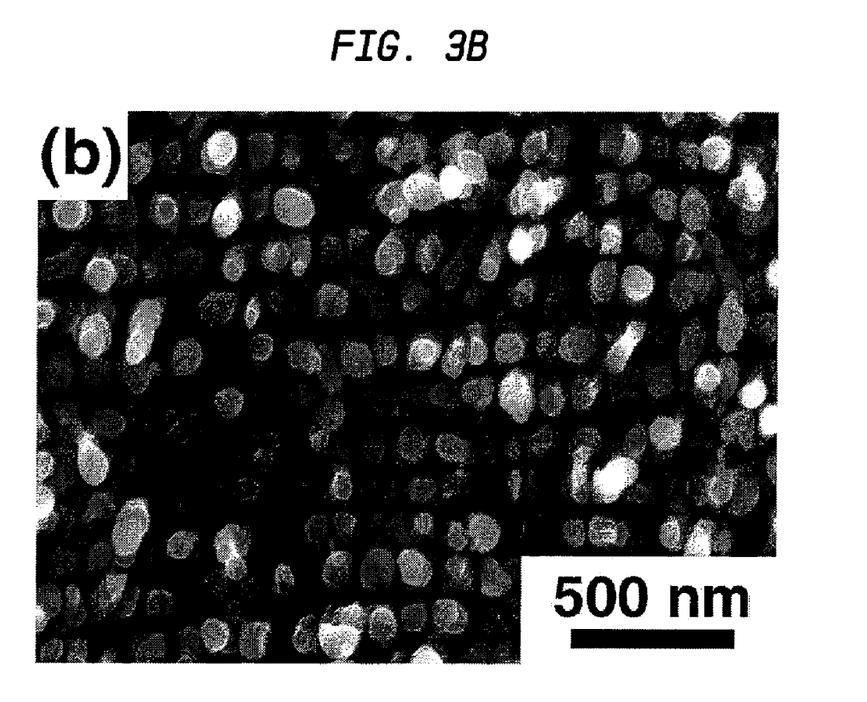
FIG. 3B is another SEM image of the structured surface shown in FIG. 3A at a different resolution.
Figure 3C:
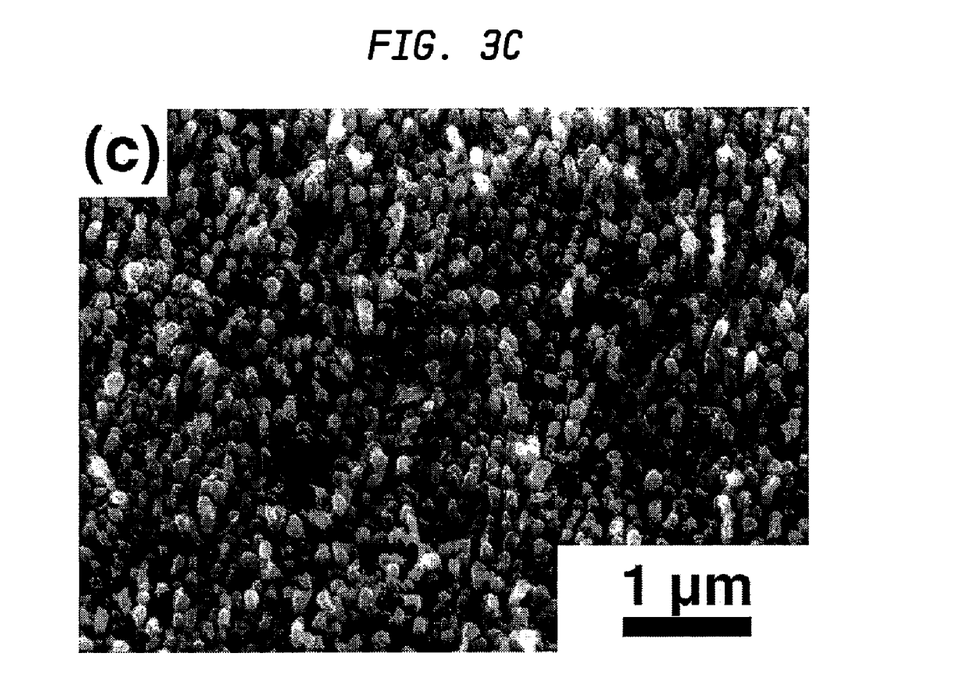
FIG. 3C is another SEM image of the structured surface shown in FIG. 3A obtained at a vantage point different than that utilized to obtain FIG. 3A.
Figure 3D:
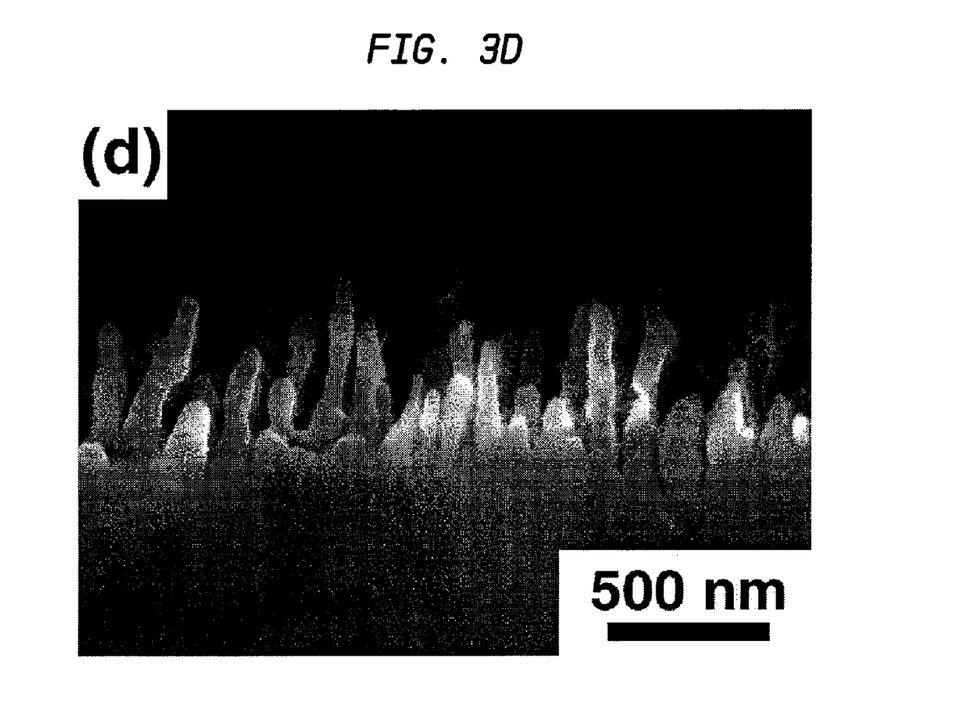
FIG. 3D is a cross-sectional SEM image of the structured silicon substrate whose surface image is shown in FIG. 3A, FIG. 4 schematically depicts an apparatus suitable for practicing methods of processing substrates in accordance with the teachings of the invention.

The second irradiation step 16 of the substrate surface with radiation pulses having a different polarization can cause the break-up of surface features generated by the first irradiation step 14 into finer-sized features. By way of example and as discussed further below in the experimental section, the irradiation of the structured silicon substrate surface shown in FIG. 2C, while the surface is in contact with water, by another set of 100 fs, 800 nm laser pulses (200 pulses per area) at a fluence of 0.5 $kJ/m^2$ with a linear polarization that is rotated by 90 degrees relative to the polarization used to initially generate the surface ripples can cause the surface ripples to break up into nanometer-sized structures, as shown in FIG. 3A-3D. More specifically, FIGS. 3A and 3B are SEM images of the surface obtained in a direction normal to the surface at different resolutions while FIGS. 3C is another SEM image of the surface obtained from a different vantage point and FIG. 3D is a cross-sectional SEM image of the structured substrate. In this case, the nanometer-sized structures are in the form of nanometer-sized rods, which are about 50 nm in diameter and up to about 400 nm tall. In other cases, the shapes and the sizes of the structures can be different.

In this manner, the two-step irradiation of the substrate surface with short laser pulses having different polarizations (orthogonal polarizations in the above embodiment) can result in the formation of fine (in many cases nanosized) surface features. By way of example, in some cases the nanosized features can include columnar spikes (e.g., rods) extending from a base to a tip that protrude above the substrate surface. In some cases, the nano-sized spikes can have heights less than about 1 micron, or less than about 500 nm with a diameter in a range of about 50 nm to about 500 nm.

In some embodiments, the surface density of the nanosized structures, i.e., the number of nanosized structures per unit surface area, formed in a substrate surface layer via the aforementioned two-step irradiation process can be greater than about $10^9$ $cm^{-2}$, e.g., in a range of about $5 \times 10^9$ $cm^2$ to about $5 \times 10^{10}$ $cm^{-2}$.

In some embodiments, the nanosized structures are formed in a top surface layer having a thickness, e.g., in a range of about 1 micrometer to about 100 micrometers.

Without being limited to any particular theory and as discussed further below, the formation of the nanosized structures in many embodiments can involve several processes: refraction of laser light in highly excited silicon, interference of scattered and refracted light, rapid cooling due to contact with a fluid, and capillary instabilities.

As noted above, a variety of fluids can be utilized in the steps 14 and 16 in the above method for structuring a substrate surface. As noted above, in some cases the fluid can be a liquid, such as water, alcohol, or an aqueous solution, e.g., one having an electron-donating constituent. For example, a solution of sulfuric acid can be applied to at least a portion of the substrate followed by irradiating that portion with short pulses (e.g., femtosecond pulses) to cause a change not only in surface topography in a manner described above but also generate sulfur inclusions within a surface layer of the substrate. In some cases, the fluid can be a gas, e.g., sulfur hexafluoride, or air. More generally, the fluid can include a dopant compound, at least a portion of which can be incorporated into a surface layer of a substrate whose surface is irradiated with the short radiation pulses.

Figure 4:
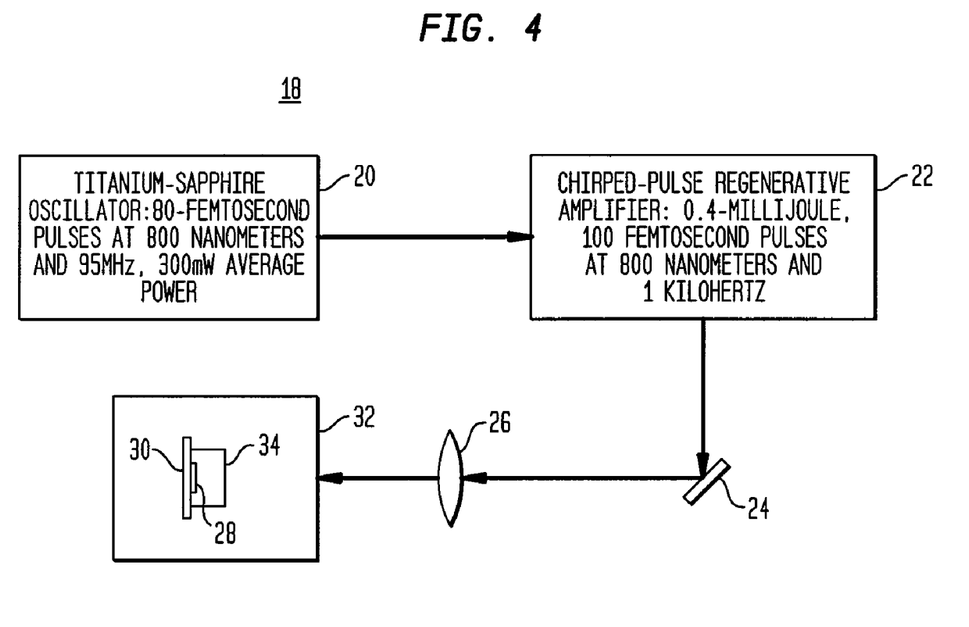

By way of example, FIG. 4 schematically depicts an apparatus 18 that can be utilized to practice a method according to the invention for structuring a substrate, such as the aforementioned embodiment discussed above with reference to the flow chart 10. The apparatus 18 includes a Titanium-Sapphire (Ti:Sapphire) laser 20 that generates laser pulses with a pulse width of 80 femtoseconds at 800 nm wavelength having an average power of 300 mW and at a repetition rate of 95 MHz. The pulses generated by the Ti:Sapphire laser 20 are applied to a chirped-pulse regenerative amplifier 22 that, in turn, produces 0.4 millijoule (mJ), 100 femtosecond pulses at a wavelength of 800 nm and at a repetition rate of 1 kilohertz.

The femtosecond laser pulses are directed via a mirror 24 to a lens 26 that in turn focuses the laser pulses onto a surface of a sample 28 (e.g., a silicon wafer) disposed on a 3-dimensional translation system 30 within a vacuum chamber 32. A glass liquid cell 34 is coupled to the stage over the sample so as to allow a sample surface to have contact with the fluid (e.g., water) contained within the cell. The three-dimensional stage allows moving the sample relative to the laser pulses for exposing different portions of the surface to radiation. The vacuum chamber can be utilized to pump out air bubbles in the fluid. Alternatively, the processing of the sample can be performed without utilizing a vacuum chamber. The aforementioned U.S. Published Patent Application No. 2006/0079062 entitled "Femtosecond Laser-Induced Formation of Submicrometer Spikes On A Semiconductor Substrate," discloses a variation of the apparatus 18 that is suitable for irradiating a substrate with laser pulses at a wavelength of 400 nm.

In some embodiments, a substrate surface is initially roughened (e.g., by generating a plurality of micro-sized structures within a surface layer) before applying short radiation pulses in the above two-step process to form nano-sized features on the roughened surface. By way of example, a substrate surface can be irradiated in presence of a background gas by short laser pulses to form micron-sized structures within a top surface layer of the substrate (e.g., a top layer having a thickness in a range of about 1 micrometer to about 100 micrometers). Subsequently, such a microstructured surface can be subjected to the aforementioned two-step irradiation process while the surface is in contact with a liquid, such as water, to generate nanometer-sized features in the microstructure surface layer, e.g., superimposed on the microstructured features.

By way of example, in some embodiments, a substrate (e.g., a semiconductor) surface can be irradiated with laser radiation pulses having pulse widths in a range of about 50 femtoseconds to about a few hundred nanoseconds (e.g., in a range of about 100 femtoseconds to about 500 femtoseconds) and having a central wavelength in a range of about 400 nm to about 800 nm while the surface is in contact with a gas, e.g., nitrogen, or sulfur hexafluoride, to generate a plurality of micro-sized spikes in a top surface layer. Further details regarding the formation of such micron-sized features can be found, e.g., in U.S. Published Application No. 2003/0029495 entitled "Systems and Methods For Light Absorption And Field Emission Using Microstructured Silicon," and U.S. Pat. No. 7,057,256 entitled "Silicon-Based Visible and Near-Infrared Optoelectric Devices," both of which are herein incorporated by reference in their entirety.

Subsequently, the microstructured surface can be placed in contact with a liquid, such as water, and exposed in a two-step process, such as that discussed above, to two sets of short laser pulses, where the polarization of the pulses in one set is different than the polarization of the pulses in the other set (e.g., the two sets can comprise linearly polarized pulses, where the direction of polarization in one set is orthogonal to the direction of polarization in the other set). For example, the short radiation pulses can have pulse widths in a range of about 50 fs to about 500 fs at a wavelength in a range of about 400 nm to about 800 nm. Similar to the previous embodiments, the substrate surface can be moved relative to the laser beam and/or the laser beam can be moved relative to the substrate surface to expose each area of the substrate surface to one or more pulses (e.g., a few hundred pulses). In this manner, combination of micron-sized and nano-sized features can be generated in a surface layer of a substrate.

In some embodiments, rather than utilizing radiation at two different polarizations in a two-step process such as those discussed above, circularly polarized radiation is employed in a one-step process (a process that utilizes only one polarization) to generate micron-sized, and preferably submicron-sized, structures with a top surface layer of a substrate, e.g., a semiconductor, a metal or an insulator). More specifically, in one such embodiment, a substrate surface can be exposed to a fluid, e.g., a gas or a liquid such as water, alcohol or any other suitable liquid, while the surface is illuminated with short radiation pulses having circular polarization of one sense (e.g., clockwise or counterclockwise). The short radiation pulses can have pulse widths, e.g., in a range of about 10 femtoseconds to about a few hundred nanoseconds (e.g., 200 ns) and more preferably in a range of about 100 fs to about 500 fs.

In some cases, the substrate is translated relative to the radiation pulses, or vice versa, so as to apply a plurality of pulses to each irradiated surface location (e.g., a number of pulses in a range of about 10 to about a few thousands (e.g., 2500), and more typically a few hundred (e.g., 200) pulses). The radiation pulse can have a fluence, e.g., 2 kJ/m$^2$ to about 40 kJ/m$^2$, and an energy in a range of about, e.g., about 10 microjoules to about 100 millijoules. Further, in some embodiments, the central wavelength of the pulses can be, e.g., in range of about 200 nm to about 800 nm, though other wavelengths can also be utilized.

The processing of a substrate by such circularly polarized pulses can lead to formation of micron-sized and preferably sub-micron sized structures in a top surface layer of the substrate, e.g., a surface layer having a thickness in a range of about 1 micrometer to about 100 micrometers.

The methods of the invention, such as the embodiments discussed above, can be applied to substrates formed of different materials. By way of example, they can be applied to semiconductor substrates, such as silicon, germanium, CdTe, CdSe, and GaAs.

By way of further illustration, the following examples provide experimental results obtained by irradiating a silicon substrate in contact with water in a two-step process in accordance with the teachings of the invention. It should be understood that the following examples are provided only for illustrative purposes and are not intended to necessarily indicate optimal results that can be obtained by practicing the methods of the invention.

EXAMPLE 1

In each of a number of experiments, a single crystalline silicon substrate sample was placed in a glass container filled with water, which was mounted on a three-axis translation stage. The sample was irradiated by a train of 100-fs, 800 nm laser pulses at a repetition rate of 1-kHz from an amplified Ti:Sapphire laser with laser energies up to about 400 microjoules (µJ). The laser pulses were focused by a 0.25-m focal length lens to travel through approximately 10 mm of water before striking the substrate surface at normal incidence. The focal point was approximately 10 mm behind the substrate surface and the spatial profile of the laser spot was nearly Gaussian. The sample was translated in a direction perpendicular to the laser beam.

The aforementioned FIG. 2A-2C show scanning electron microscope (SEM) images of structures formed on three silicon substrate in water at three different laser fluences using an average irradiation of 200 laser pulses per area. As shown in FIG. 2A, at a laser fluence of 25 kJ/m$^2$, micrometer-sized structures and submicrometer-sized holes were formed in a substrate surface layer. As shown in FIG. 2B, at a lower fluence of 5 kJ/m$^2$, which lies in a medium fluence range of about 4 to about 10 kJ/m$^2$, a plurality of ripple-like structures were formed with spacing between adjacent ripples substantially equal to the laser wavelength (in this case 800 nm). The ripples were substantially straight with their long axis perpendicular to the laser polarization. As shown in FIG. 2C, at a lower fluence of about 3 kJ/m$^2$, which lies in a low-fluence range of about 2 to about 4 kJ/m$^2$, straight ripples are formed with a spacing of about 120 nm with the long axis of the ripples perpendicular to the laser polarization.

The surface ripples shown in FIG. 2C were irradiated again with 100 fs, 800 nm laser pulses (an average of 200 pulses per area) while the substrate surface remained in contact with water. The polarization of the laser pulses was, however, rotated by 90° relative to the polarization originally used to form the ripples. In other words, the polarization of the laser pulses in the second irradiation step was substantially parallel with the long axis of the ripples. The second irradiation step caused the break-up of the ripples into the nanometer-scale structures shown in FIG. 3A-3D. These structures include nanometer-sized rods, which are about 50 nm in diameter and up to about 400 nm tall, which substantially uniformly cover the surface.

Without being limited to any particular theory, the three distinct surface morphologies presented in FIGS. 2A-2C after the first irradiation step can be attributed to different types of laser interaction with the silicon/water system: ultrafast melting and resoldification at low fluence, ultrafast melting and ablation at medium fluence, and ultrafast melting, ablation and bubble cavitation at high fluence.

For example, the straight ripples formed approximately normal to the light polarization in the medium fluence region with a spacing substantially equal to the laser wavelength can be attributed to the interference between light that is scattered at a roughened surface and light that is refracted at the surface: the light interferes just below the surface and is absorbed in a non-uniform periodic ripple pattern. For an optically thick molten layer, the periodic absorption pattern excites surface waves in the molten layer and the ripples are "frozen" into the surface upon solidification.

In the low fluence regime, the front portion of a laser pulse can excite a large number of electrons, thus causing an increase in the index of refraction in a thin surface layer of silicon. Within this high-index layer, the effective wavelength of the refracted and scattered light can be reduced, thus causing a reduction in the periodicity of the interference pattern. Approximately one picosecond after the laser pulse strikes the surface, ultrafast melting produces a liquid layer whose evolution is dictated by surface-wave driven growth dynamics. The periodic absorption excites nanometer-scale surface waves in the liquid layer, which upon resolidification are "frozen" into nanometer-scale ripples.

In the high fluence regime, the irradiation fluence can be above the ablation threshold, and consequently a thin layer of high-index silicon is ablated away and no nanometer-scale ripples are observed.

Generally, the surface morphology after laser pulse irradiation in many cases can be due to an interplay between surface wave dynamics and the lifetime of a molten layer generated by the pulses. Taking into account that the melt depth can be large compared to 120 nm and including damping due to viscosity, a lifetime of approximately 1 ns can be obtained for a surface wave with a wavelength of 120 nm. For surfaces irradiated in a gas, the lifetime of the melt can be longer than about 30 ns, that is, much longer than the lifetime of a surface wave with a wavelength of 120 nm. As such, by the time the surface resolidifies, any nanometer-scale surface waves have died out and been replaced by surface waves with longer wavelengths and longer lifetimes. The thermal conductivity of water is, however, over one order of magnitude higher than that of a typical gas, and water vaporizes and dissociates on the substrate surface. The larger thermal conductivity of water and its vaporization and dissociation can result in a large heat transfer out of the molten layer, and so the lifetime of the molten layer in water can be less than about 1 ns. The presence of water in contact with the substrate surface and the associated increase in the cooling rate of the molten layer can allow for the nanometer-scale ripple patterns to be frozen into the surface before they die away.

As noted above, FIGS. 3A-3D show that during the second irradiation step of the nanometer-scale ripples shown in FIG. 2C, nanometer-scale rods form along the ripples. Although the second irradiation is at a much lower fluence than the first irradiation step, the laser pulses cause melting of the nanometer-scale ripples as the radiation absorptance of a rippled surface can be higher than that of a smooth surface. Once they are molten, the ripples tend to break up into beads, presumably because a molten half-cylinder can be unstable. Similar to the formation of the ripples, the size of the beads can be set by the interference between incident and scattered laser light below the surface, which can produce a periodic absorption pattern along the long axis of the ripples. Once the ripples break up into beads, subsequent laser irradiation can sharpen the beads into rods through preferential removal of material around the beads by laser-assisted ablation.

EXAMPLE 2

In another set of experiments, a flat silicon substrate surface was initially irradiated by 100 fs, 500-microJoule, 800 nm laser pulses while the surface was in contact with $SF_6$ gas in a manner disclosed in an article entitled "Microstructuring of silicon with femtosecond laser pulses" by Her et al., published in Appl. Phys. Lett. 73, 1673 (1998), which is herein incorporated by reference, to form micron-sized spikes in top surface layer. The microstructured surface was subjected to the two-step irradiation process discussed above, where the polarization in one step was orthogonal to that in the other step. These SEM images of the resulting surface at different resolutions, presented in FIGS. 5A, 5B, and 5C, show nanometer-sized rods that cover the entire microstructured surface, protruding substantially normal to the surface regardless of the original surface morphology.

Figure 5A:
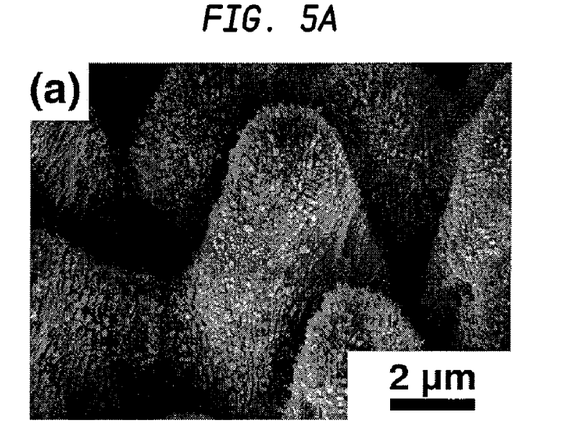
FIGS. 5A-5C are SEM images of a silicon substrate surface which was initially roughened and was then subjected to a two-step irradiation process in accordance with an embodiment of a substrate processing method of the invention, at different magnifications.
Figure 5B:
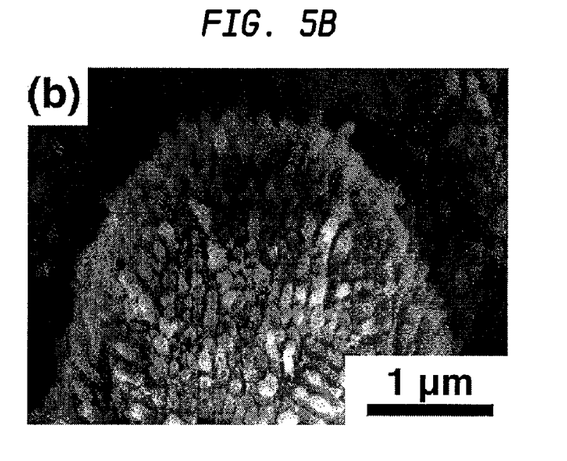
Figure 5C:
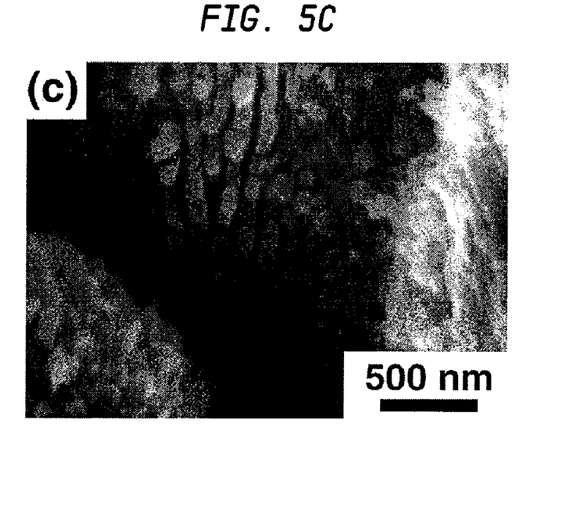

FIGS. 5A-5C provide further evidence of the role of a high-index, molten silicon layer in the formation of nanometer-sized ripples and rods: the nanometer-sized rods cover the entire surface of each micrometer-sized spike and are normal to the surface of the spike. The high-index layer at the surface of each micrometer-sized spike strongly refracts the laser light the refracted laser light becomes nearly perpendicular to every part of the solid silicon surface, which creates a temperature gradient approximately perpendicular to the surface. Consequently, the nano-sized rods are formed approximately normal to the sample surface.

Those having ordinary skill in the art will appreciate that various changes can be made to the above embodiments without departing from the scope of the invention.

The invention claimed is:

1. A method of processing a substrate, comprising
    irradiating at least a portion of a substrate surface with a first set of a plurality of polarized short radiation pulses having a first polarization while exposing said surface portion to a fluid so as to generate a plurality of surface structures,
    irradiating said structured surface with a second set of a plurality of polarized short radiation pulses having a second polarization different than said first polarization while exposing the structured surface to a fluid.

2. The method of claim 1, wherein said short radiation pulses in said first and second set exhibit temporal durations in a range of about 10 fs to about a few hundred nanoseconds.

3. The method of claim 2, wherein the temporal durations of the pulses lie in a range of about 100 fs to about 500 fs.

4. The method of claim 1, wherein a central wavelength of said radiation pulses in said first and second sets lies in a range of about 200 nm to about 800 nm.

5. The method of claim 1, wherein a central wavelength of said first set is substantially similar to a central wavelength of said second set.

6. The method of claim 1, wherein a central wavelength of said first set is different than a central wavelength of said second set.

7. The method of claim 1, wherein said second set of radiation pulses causes formation of nano-sized surface structures.

8. The method of claim 1, wherein said first set of radiation pulses causes formation of micron-sized surface structures.

9. The method of claim 1, wherein said fluid to which the surface is exposed during irradiation by the first set of pulses is the same type as the fluid to which the surface is exposed during irradiation by the second set of pulses.

10. The method of claim 1, wherein said fluid to which the surface is exposed during irradiation by the first set of pulses is a different type than the fluid to which the surface is exposed during irradiation by the second set of pulses.

11. The method of claim 1, wherein said fluid to which the surface is exposed during any of the first or the second set of radiation pulses comprises a liquid.

12. The method of claim 11, wherein said liquid comprises any of a polar or a non-polar liquid.

13. The method of claim 12, wherein said liquid comprises any of water or alcohol.

14. The method of claim 1, wherein said fluid to which the substrate surface is exposed during any of the first or second set of radiation pulses comprises a gas.

15. The method of claim 1, wherein said gas comprises any of $SF_6$, $N_2$ or air.

16. The method of claim 1, wherein a fluence of the pulses in any of the first or the second set is less than about 40 $kJ/m^2$.

17. The method of claim 1, wherein a fluence of the pulses in any of the first or the second set is in a range of about 2 $kJ/m^2$ to about 30 $kJ/m^2$.

18. The method of claim 1, wherein a fluence of the pulses in the second set is less than a fluence of the pulses in the first set.

19. The method of claim 1, wherein said substrate comprises a semiconductor substrate.

20. The method of claim 19, wherein said semiconductor substrate comprises any of silicon, germanium, CdTe, CdSe, and GaAs.

21. The method of claim 1, wherein said first and second sets of the short radiation pulses comprises circularly polarized pulses with polarization in one set being clockwise and the polarization in the other set being counter-clockwise.

22. A method of processing a substrate, comprising
    generating a plurality of micron-sized structures in a top surface layer of the substrate,
    irradiating at least a portion of the structured substrate surface with a first set of polarized short radiation pulses while exposing said surface portion to a fluid,
    subsequently, irradiating said structured surface with a second set of polarized short radiation pulses having a different polarization than that of the first set while exposing the structured surface to a fluid so as to generate a plurality of nanosized structures on said micron-sized structures.

23. The method of claim 22, wherein the step of generating a plurality of micron-sized structures comprises irradiating a surface of the substrate to a plurality of short radiation pulses while the surface is in contact with a gas.

24. The method of claim 22, wherein said gas comprises an electron-donating constituent.

25. The method of claim 22, wherein said gas comprises any of $SF_6$, $N_2$ or air.

* * * * *